(12) United States Patent
Vercellesi

(10) Patent No.: US 10,017,261 B2
(45) Date of Patent: Jul. 10, 2018

(54) ELECTRIC REDUNDANT CIRCUIT

(71) Applicant: ALENIA AERMACCHI S.P.A., Venegono Superiore (VA) (IT)

(72) Inventor: Marco Francesco Vercellesi, Venegono Superiore (IT)

(73) Assignee: ALENIA AERMACCHI SPA, Venegono Superiore (VA) (IT)

( * ) Notice: Subject to any disclaimer, the term of this patent is extended or adjusted under 35 U.S.C. 154(b) by 204 days.

(21) Appl. No.: 14/650,143

(22) PCT Filed: Dec. 2, 2013

(86) PCT No.: PCT/IB2013/060557
§ 371 (c)(1),
(2) Date: Jun. 5, 2015

(87) PCT Pub. No.: WO2014/087316
PCT Pub. Date: Jun. 12, 2014

(65) Prior Publication Data
US 2015/0314880 A1  Nov. 5, 2015

(30) Foreign Application Priority Data
Dec. 6, 2012 (IT) .............................. TO2012A1051

(51) Int. Cl.
*H05B 3/16* (2006.01)
*B64D 15/12* (2006.01)
(Continued)

(52) U.S. Cl.
CPC .............. *B64D 15/12* (2013.01); *F02K 1/827* (2013.01); *H05B 3/145* (2013.01); *H05B 3/22* (2013.01);
(Continued)

(58) Field of Classification Search
CPC ............ B64D 15/12; B64D 2033/0206; B64D 2033/0233; F02K 1/827; H05B 3/22;
(Continued)

(56) References Cited

U.S. PATENT DOCUMENTS 3,216,089 A * 11/1965 Dettman ................ H05K 3/202
174/252
4,078,160 A * 3/1978 Bost ...................... B06B 1/0603
310/331
(Continued)

FOREIGN PATENT DOCUMENTS

EP  1 060 645  12/2000

OTHER PUBLICATIONS

International Search Report for International Application No. PCT/IB2013/060557 dated Feb. 26, 2014 (3 pages).

*Primary Examiner* — Shawntina Fuqua
(74) *Attorney, Agent, or Firm* — Merchant & Gould P.C.

(57) ABSTRACT

An electronic circuit allows at least one current to flow between at least two points of the same circuit. The electronic circuit is in contact with a structure (P) and includes at least one graph (2) including a plurality of nodes (24) and a plurality of connections or branches (22) between the nodes (24) that create at least one mesh (M) of interconnections. The at least one mesh (M) includes interconnections that are configured at least two interconnections between two nodes (24) created by the plurality of connections or branches (22).

8 Claims, 3 Drawing Sheets

(51) Int. Cl.
  *H05B 3/22* (2006.01)
  *H05K 1/02* (2006.01)
  *F02K 1/82* (2006.01)
  *H05B 3/14* (2006.01)
  *H05B 3/34* (2006.01)
  *B64D 33/02* (2006.01)

(52) U.S. Cl.
  CPC ............... *H05B 3/34* (2013.01); *H05B 3/342* (2013.01); *H05K 1/0212* (2013.01); *H05K 1/0296* (2013.01); *H05K 1/0298* (2013.01); *B64D 2033/0206* (2013.01); *B64D 2033/0233* (2013.01); *H05B 2203/007* (2013.01); *H05B 2203/013* (2013.01); *H05B 2203/014* (2013.01); *H05B 2203/037* (2013.01); *H05B 2214/02* (2013.01); *H05K 2201/0979* (2013.01); *H05K 2201/09681* (2013.01); *Y02T 50/672* (2013.01)

(58) Field of Classification Search
  CPC .......... H05B 3/145; H05B 3/34; H05B 3/342; H05B 2203/007; H05B 2203/013; H05B 2203/014; H05B 2203/037; H05B 2214/02; H05K 1/0212; H05K 1/0296; H05K 1/0298; H05K 2201/09681; H05K 2201/0979; Y02T 50/672
  See application file for complete search history.

(56) References Cited

U.S. PATENT DOCUMENTS 6,137,083 A * 10/2000 Bost ................ B64D 15/12
  219/201
7,923,668 B2 * 4/2011 Layland ............. B64D 15/12
  219/529

* cited by examiner

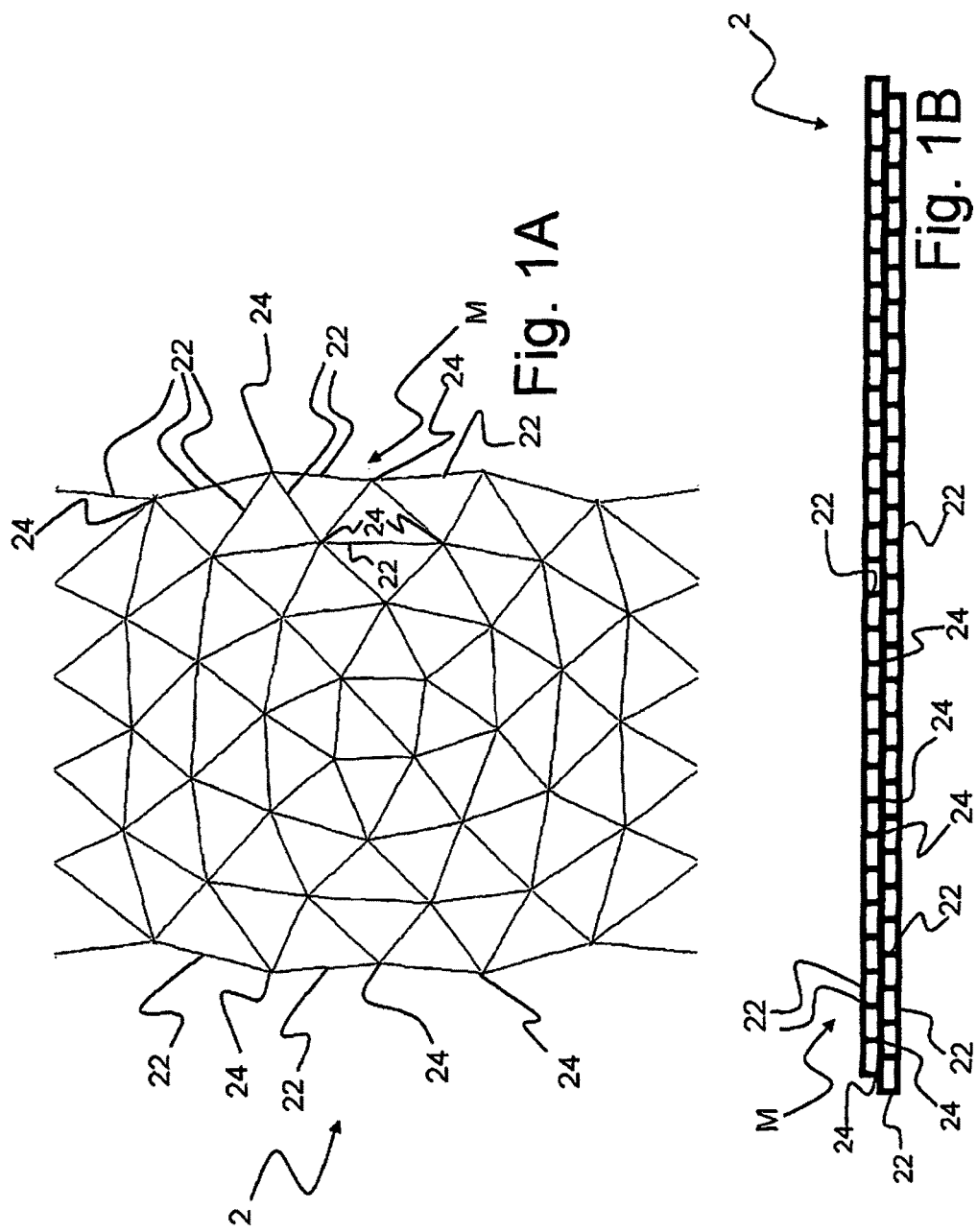

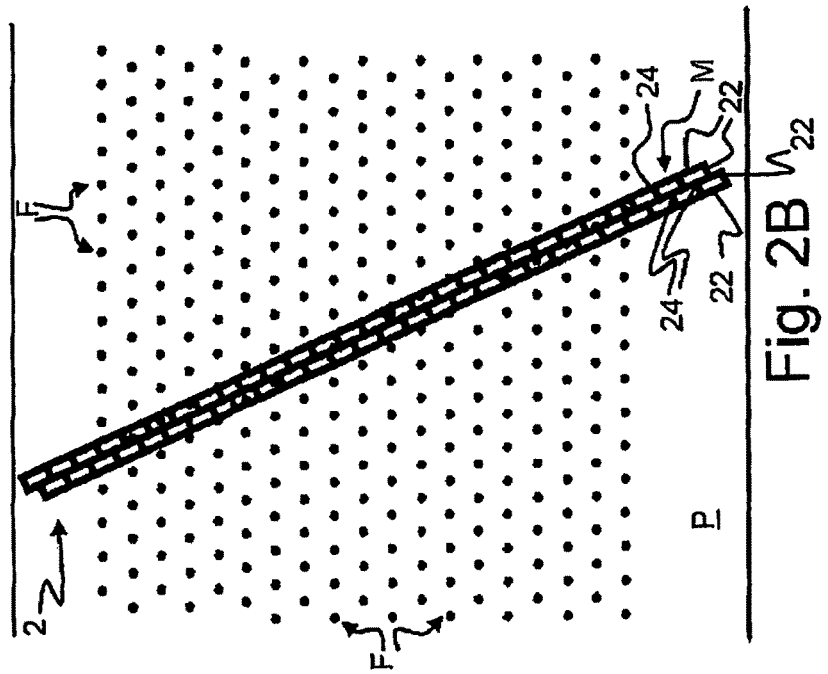
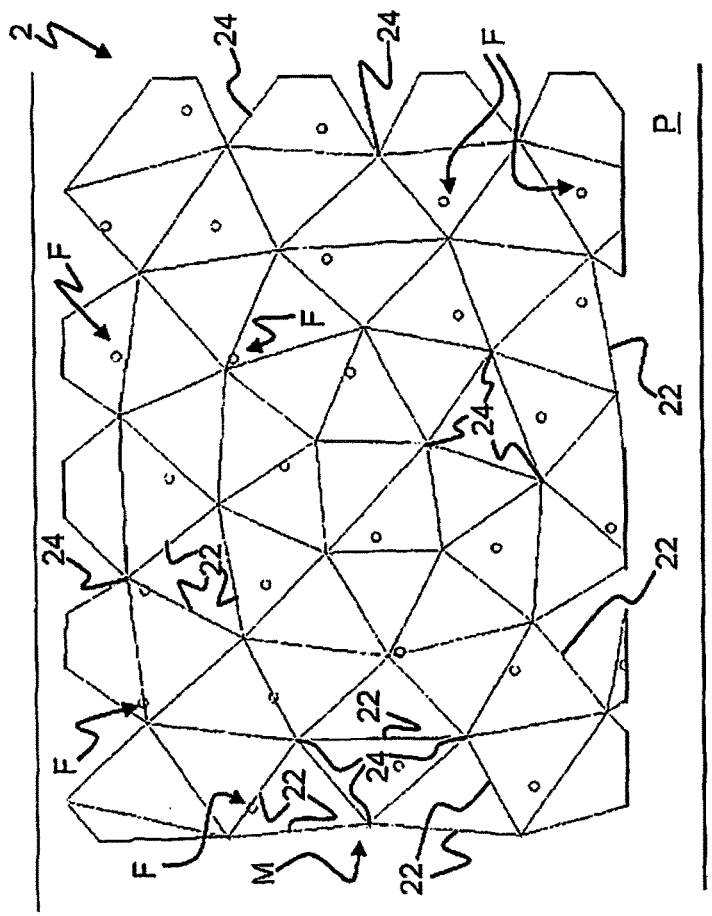
Fig. 2A
Fig. 2B

ELECTRIC REDUNDANT CIRCUIT

This application is a National Stage Application of PCT/IB2013/060557, filed 2 Dec. 2013, which claims benefit of Serial No. TO2012A001051, filed 6 Dec. 2012 in Italy and which applications are incorporated herein by reference. To the extent appropriate, a claim of priority is made to each of the above disclosed applications.

BACKGROUND

The present invention relates to a solid-state electronic circuit placed in contact with a structure. The circuit, which comprises a plurality of redundant connections or branches and nodes, is intrinsically resistant to interruptions of a plurality of interconnections between the nodes, thereby preserving the continuity and functionality of the circuit even in the presence of multiple single interruptions of connections or branches of the same circuit. Continuity and functionality of the circuit are ensured in a high percentage of cases, approx. 99.99%.

Such circuits may have many applications depending on the structure with which they are associated, in particular placed in contact.

The circuits according to the present invention can be associated with panels, e.g. soundproof panels.

Said soundproof panels find application in the aeronautics field.

Soundproof panels are generally formed by multiple layers (sandwich), and comprise two surfaces or skins and one spacer element. Said spacer normally has a honeycomb structure. The surface exposed to the air flow is perforated, in a manner such that a Helmholtz resonator is obtained in each honeycomb cell.

Generally, these soundproof panels are not heated.

Generally, during the flight mission these panels are subject, whether directly or indirectly, to icing.

The evolution of the requirements concerning icing severity and soundproofing anticipated by the flight safety bodies urges to create soundproof panels which are heated, for example, by electronic circuits capable of resisting to interruptions caused by panel perforation. In particular, difficulties are encountered in ensuring continuity of the electric circuit following the panel perforation operations.

The electronic circuits included in soundproof panels, such as, for example, heating elements, are normally buried in a rolled carbon sheet.

In the art are known some devices as described in their respective documents.

U.S. Pat. No. 6,137,083A discloses a heating device comprising electrically conducting longitudinal fibers extending substantially parallel to a leading edge of the aerofoil close to said leading edge, and means for electrically connecting the ends of the longitudinal conducting fibers to an electric power supply. The conducting fibers are grouped together in conducting rovings forming part of a hybrid fabric which furthermore includes a weft of electrically insulating fibers woven together and woven with the conducting rovings.

EP1060645A1 discloses an electronics device comprising a carrier, such as a printed circuit board, a substrate or a chip, and an electric conductor on a surface of the carrier. The surface of the conductor facing away from the carrier has a surface structure in the form of flanges which are defined by etched grooves.

U.S. Pat. No. 7,923,668B2 discloses an engine nacelle inlet lip including both acoustic treatment and electric heating for ice protection. The inlet lip has a composite outer skin and a composite inner skin, with the composite outer skin having at least one integrated heater element embedded in the composite material. An acoustic cellular core positioned between the outer and inner skin acts to attenuate fan noise from the engine. Covering the outer skin and overlying the acoustic core is a perforated erosion shield having a first set of openings that pass entirely thorough its thickness. The composite outer skin includes a second set of openings such that sound waves can pass from an inner barrel portion of the inlet lip through the erosion shield, outer skin, and heater element to the underlying acoustic cellular core.

U.S. Pat. No. 3,216,089A relates to a technique for making electrical circuitry and more particularly to a technique employing preformed elements incorporating conductor elements, a frame and support members which provide mechanical continuity during assembly operations.

SUMMARY

The present invention aims at solving the above-mentioned technical problems by providing a redundant circuit directly in contact with the structure with which said circuit is associated.

Auxiliary features of the circuit are set out in the appended dependent claims.

BRIEF DESCRIPTION OF THE DRAWINGS

The features and advantages of the circuit according to the present invention will become apparent from the following description of different embodiments thereof and from the annexed drawings, wherein:

FIGS. 1A and 1B show two different embodiments of the circuit according to the present invention; FIG. 1A shows a redundant circuit with random topography, whereas FIG. 1B shows a circuit with structured topography;

FIGS. 2A and 2B show the circuits of FIG. 1 in contact with the structure with which they are associated, wherein on said structure there are a plurality of interruptions with different topographies;

DETAILED DESCRIPTION

Figure 3:
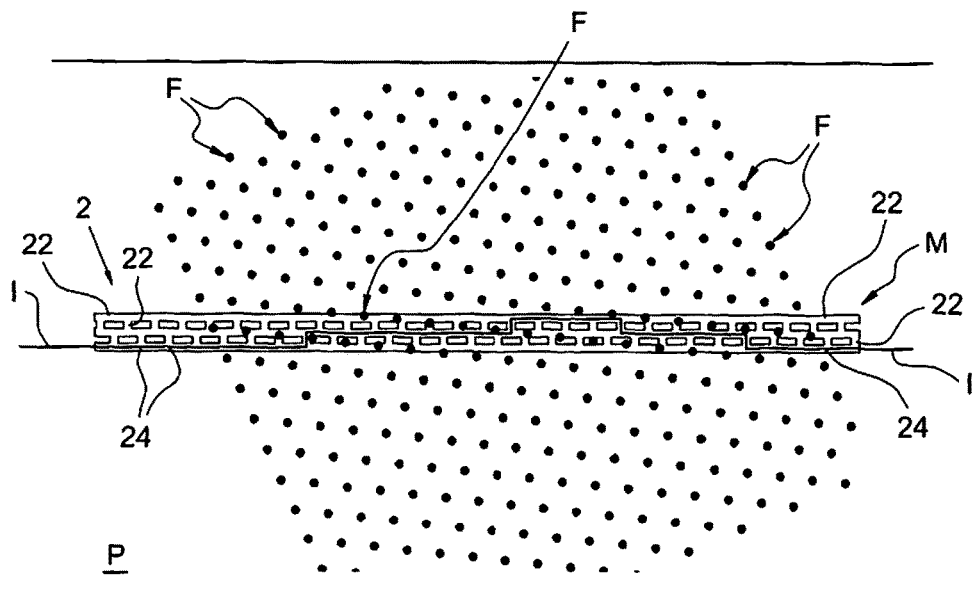
FIG. 3 shows a path followed by current flowing in circuit 2A after the interruptions.

With reference to the above-mentioned drawings, the solid-state electronic circuit for allowing at least one current to flow between at least two points of the same circuit is in contact with a structure "P", as can be seen, for example, in FIGS. 2A and 2B.

For the purposes of the present invention, the term "solid-state electronic circuit" refers to a circuit comprising physical components only, such as solid-state communication means and/or supports, in particular wherein the signal is not transmitted via radio waves or wireless means. The phrase "in contact with a structure "P"" means that said circuit is in direct contact with said structure, e.g. secured to a surface thereof or buried in it, e.g. buried in a preferably composite structure.

The circuit comprises at least one graph 2 including a plurality of nodes 24 and a plurality of connections or branches 22 between said nodes 24 that create at least one mesh "M" of interconnections.

For the purposes of the present invention, the term "graph" refers to a discrete structure wherein the arcs are the connections or branches and the nodes are the interconnection nodes between the various connections or branches.

For the purposes of the present invention, the term "mesh" refers to at least one closed electric path in which an electric current can flow.

Said at least one mesh "M" comprises a plurality of connections or branches 22, which are so configured that any two nodes 24 are interconnected via at least two paths created by means of said connections or branches 22. The electric circuit is redundant because there are a plurality of paths for conducting an electric/electronic current between any two nodes 24.

In a first embodiment, e.g. as shown in FIG. 1A, said graph 2, in particular said mesh "M", has a random topography.

For the purposes of the present invention, the term "random topography" means that the topographic arrangement of nodes 24 and/or the length of connections or branches 22 and/or the number of connections or branches 22 reaching a single node 24 is not constant and regular.

In a second embodiment, e.g. as shown in FIG. 1B, said graph 2, in particular said mesh "M", has a structured topography.

For the purposes of the present invention, the term "structured topography" means that the topographic arrangement of nodes 24 and the length of connections or branches 22 and the number of connections or branches 22 reaching a single node 24 is predetermined, constant and regular.

The choice of implementing one embodiment or the other also depends on the shape and nature (random or structured) and the distribution (probabilistic or deterministic) of the damages suffered by structure "P", which damages may cause interruptions in the circuit.

The damages suffered by structure "P" may be holes intentionally made in order to create a function, e.g. an acoustic one, of the panel, or formed during the service life of the structure itself.

The topography of the circuit according to the present invention allows arranging said circuit in contact with the structure with any orientation, e.g. with respect to the longitudinal and transversal directions of the structure itself, while still preserving its characteristic of obtaining at least one current path even after a plurality of interruptions on graph 2, as shown by way of example in FIGS. 2A and 2B. In these drawings, the orientation of the circuit does not follow the directrices of the structure, e.g. longitudinal and transversal.

When the circuit is interrupted because of a random or predetermined distribution of damages in structure "P", the same circuit will have a smaller number of interconnections between nodes 24 than the initial one, due to interruption of various branches or connections 22 and various nodes 24. The efficiency and functionality of the circuit will be ensured with a given probability. Therefore, with a certain probabilistic level, there will be one or more electric current paths that will have survived the interruptions. Said surviving circuits will allow at least one current to flow, thus ensuring the functionality of the circuit. FIG. 3 highlights a path for current "I" which has survived the interruptions.

In the preferred embodiment, said plurality of connections or branches 22 and said plurality of nodes 24 are created with a laminar structure, more preferably such that graph 2 has a laminar shape.

For the purposes of the present invention, the term "laminar shape" means that the thickness of graph 2 is negligible compared with its longitudinal and transversal extension, thus forming, for example, a substantially two-dimensional structure.

In one embodiment of the circuit according to the present invention, said circuit is a printed circuit.

For the purposes of the present invention, the term "printed circuit" refers to one or more layers of insulating material on which a plurality of tracks of conductive material are laid, which are adapted to form at least one portion of graph 2, or a physical support, e.g. a textile or non-textile one, on which a plurality of tracks of conductive material are created, which are adapted to form a portion of graph 2, e.g. by metallization or photoengraving of parts thereof.

More in detail, said printed circuit is a multilayer circuit.

In an alternative embodiment, said circuit is made of conductive material, with a laminar structure which is laid like a carpet in the structure of composite material while manufacturing structure "P" itself. In the preferred embodiment, the circuit is buried in carbon fibre. In the present embodiment, structure "P" is made of composite material, comprising carbon fibre.

In an alternative embodiment, the circuit has a single-layer or multilayer laminar structure. In these two last embodiments, the laminar structure performs a self-bearing function and requires no physical support.

The circuit of the present invention can be manufactured by engraving and/or deposition or pressing.

In a preferred embodiment, said plurality of connections or branches 22 have all the same electric characteristics.

For the purposes of the present invention, the term "electric characteristics" means that each connection or branch 22 has predetermined dimensional and physical characteristics, such as thickness and width, that give it known electric properties, e.g. equivalent resistance and conduction.

A first possible application of the circuit according to the present invention is as a heating element. In the present embodiment, said plurality of connections or branches 22 have such electric characteristics as to emit heat when run by electric current, for the purpose of heating said structure "P". In this application, the width and material used are optimal to allow conduction and irradiation of heat in order to warm up that portion of structure "P", with which the circuit has been placed in contact, which surrounds the circuit itself. The material chosen for branches 22 is such that it allows the utmost heat conduction and/or the utmost efficiency in generating heat through the Joule effect, as is known to the man skilled in the art. The circuit according to the present invention is implemented in so-called "anti-icing" or "de-icing" systems.

A second possible application of the circuit according to the present invention is as a communication line. In the present embodiment, said plurality of connections or branches 22 has such electric characteristics as to allow conduction of a plurality of electric signals between a transmitter and a receiver.

In this application, the electric characteristics of the connections or branches must be such that they can be correctly coupled to the transmission and reception devices, in particular ensuring, for example, a known characteristic impedance.

In this type of application, the circuit can conduct an electric signal, including data, or electric energy for powering one or more electric devices, e.g. sensors or actuators, located in the proximity of structure "P" with which the circuit has been placed in contact. The circuit can thus be used as an element for conducting electric energy and/or an electric and/or electronic signal useful for managing and/or controlling sensors and/or actuators.

Said structure "P" is a structural or covering element of a device, such as, for example, an aircraft, a vehicle or a boat.

Said structure may be an internal element of the aircraft or an external element.

In the preferred embodiment, structure "P" is a panel, e.g. a soundproof panel. Panel "P" is, for example, adapted for aircraft application. Said panel is preferably applied in air intakes and/or nacelles of airplanes, which contain systems such as, for example, engines or tanks.

Said panel is preferably at least partly made of composite material.

Figure 4:
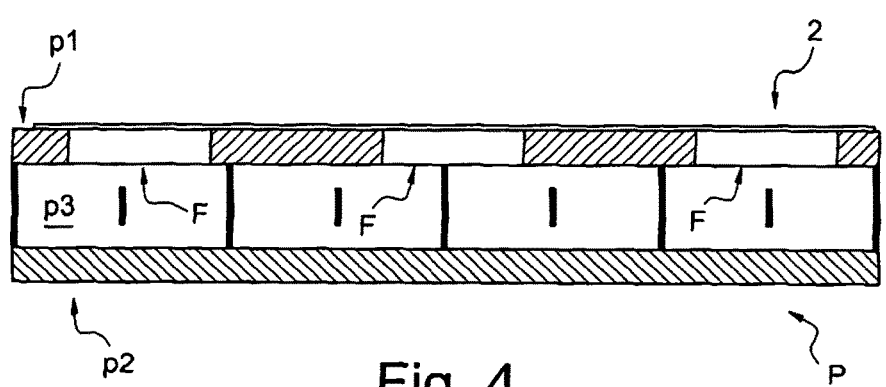
FIG. 4 shows a panel with which a redundant circuit has been placed in contact, in accordance with the present invention.

One example of embodiment of the panel is shown in FIG. 4. FIG. 4 shows, in fact, a soundproof panel. Said panel "P" comprises two surfaces or skins (p1, p2) and at least one spacer element "p3". Preferably, said at least one spacer element "p3" has a honeycomb structure.

Said panel "P" comprises a plurality of holes "F" arranged according to a predetermined or random layout, and made after assembling the parts comprised in the panel itself.

A first surface "p1" of the panel "P", exposed to the air flow, comprises said plurality of holes "F", in a manner such that a Helmholtz resonator is obtained in each cell of the honeycomb. A second surface "p2" is not perforated.

The distribution of the holes on said panel "P" may have a structured or regular topography, wherein, for example, the distance between the various holes is in the range of 5 to 20 mm, the hole having a diameter of 1 to 4 mm. In an alternative embodiment, the panel may have a hole distribution with random topography.

The adoption of redundant electric circuits, which are intrinsically resistant to interruptions, reduces the problems relating to the positioning of the circuit, e.g. used as a heating element, on a structure, e.g. a panel that will have to be perforated.

The present invention ensures low-cost production of the same circuits and of structure "P" with which the circuit is to be placed in contact, even following damages suffered by the structure itself.

The use of redundant circuits placed in contact with structure "P" allows to meet the safety requirements, e.g. concerning aircraft appendices, proposed in the EASA CS25 Regulations for anti-icing protection.

In the preferred embodiment, the present invention transforms the soundproof panel comprised in a nacelle into a part protected from icing.

The use of the circuit according to the present invention allows to create anti-icing systems by implementing a solution wherein the water captured by the air intake is kept in the liquid state up to the engine inlet and is then processed by the engine, resulting in higher energetic efficiency, unlike prior-art solutions in which all the water captured by the air intake is transformed into gaseous phase. Furthermore, systems can be created which implement a solution wherein a part of the water is transformed into gaseous phase and the remaining part is managed in relation to the ice ingestion limits of the engine.

The use of redundant electric circuits with any topography and material, whether supported or not, single-layer or multilayer, constituting a laminar layer fastened to the structure or integrated into a structure to be re-processed and/or damaged, e.g. by perforation, allows solving the above-mentioned problems whenever said re-processing or damage involves the risk of interrupting the connections of said circuits.

REFERENCE NUMERALS

Graph 2
Connections or branches 22
Nodes 24
Holes F
Current path I
Mesh M
Structure/panel P
First surface or skin p1
Second surface p2
Spacer p3

The invention claimed is:

1. An assembly of a panel and an electronic circuit, the electronic circuit being adapted to allow at least one current to flow between two points of the same circuit;
    said electronic circuit is in contact with a structure of said panel and comprises at least one graph including a plurality of nodes and a plurality of connections or branches between said nodes that create at least one mesh of interconnections;
    said at least one mesh comprises a plurality of interconnections, which are configured so at least two interconnections are between any two nodes, created by said plurality of connections or branches;
    said plurality of connections or branches have all the same electric characteristics, adapted to:
        emit heat when run by electric current, for heating said panel;
        allow conduction of a plurality of electric and electronic signals between a transmitter and a receiver;
    said electronic circuit being laid on said panel, said panel being perforated to define a plurality of holes arranged in a predetermined layout.

2. The assembly according to claim 1, wherein said mesh has a random topography.

3. The assembly according to claim 1, wherein said mesh has a structured topography.

4. The assembly according to claim 1, wherein said plurality of connections or branches and said plurality of nodes are created with a laminar structure.

5. The assembly according to claim 4, wherein said circuit is a printed circuit.

6. The assembly according to claim 4, wherein said circuit is a multilayer circuit.

7. The assembly according to claim 1, wherein said panel is a soundproof panel for aircraft application.

8. The assembly according to claim 7, wherein said soundproof panel comprises a plurality of holes arranged according to a predetermined layout and obtained when assembling parts of the panel.

* * * * *